(12) United States Patent
Kasahara et al.

(10) Patent No.: US 7,514,824 B2
(45) Date of Patent: Apr. 7, 2009

(54) SLIDING SYSTEM WITH ONBOARD LINEAR MOTOR

(75) Inventors: Shin Kasahara, Minato-ku (JP); Masaki Ohno, Kamakura (JP)

(73) Assignee: Nippon Thompson Co., Ltd., Tokyo (JP)

( * ) Notice: Subject to any disclaimer, the term of this patent is extended or adjusted under 35 U.S.C. 154(b) by 506 days.

(21) Appl. No.: 11/335,540

(22) Filed: Jan. 20, 2006

(65) Prior Publication Data
US 2006/0186741 A1    Aug. 24, 2006

(30) Foreign Application Priority Data
Feb. 23, 2005    (JP) .............................. 2005-046537

(51) Int. Cl.
*H02K 41/00*    (2006.01)
(52) U.S. Cl. .............................. 310/12; 355/53; 355/72
(58) Field of Classification Search .................... 310/12; 355/53, 72
See application file for complete search history.

(56) References Cited

U.S. PATENT DOCUMENTS

| | | | | |
|---|---|---|---|---|
| 6,573,623 B2 * | 6/2003 | Tsuboi et al. | .................. | 310/12 |
| 6,734,583 B2 * | 5/2004 | Fujisawa et al. | .............. | 310/12 |
| 7,170,204 B2 * | 1/2007 | Kitade | .......................... | 310/12 |
| 7,220,090 B2 * | 5/2007 | Wakazono et al. | .......... | 409/235 |
| 2006/0186741 A1 * | 8/2006 | Kasahara et al. | .............. | 310/12 |
| 2007/0257564 A1 * | 11/2007 | Kitade et al. | ................... | 310/12 |
| 2007/0278866 A1 * | 12/2007 | Ida et al. | ....................... | 310/12 |

FOREIGN PATENT DOCUMENTS

| | | |
|---|---|---|
| JP | 9-123034 | 5/1997 |
| JP | 2000-193060 A | 7/2000 |
| JP | 2002-010617 A | 1/2002 |

* cited by examiner

*Primary Examiner*—Gary F. Paumen
(74) *Attorney, Agent, or Firm*—Browdy and Neimark, PLLC

(57) ABSTRACT

A sliding system has an X-table and a Z-table, which are actuated by linear motors, respectively. The Z-table is arranged on the X-table at the same side of the X-table as a bed is laid. A linear motor is placed between the bed and the X-table while another linear motor is installed between the X-table and the Z-table. The X-table doubles as yokes for the linear motors. The sliding system constructed as stated earlier is made slim or compact in height or thickness.

1 Claim, 4 Drawing Sheets

SLIDING SYSTEM WITH ONBOARD LINEAR MOTOR

FIELD OF THE INVENTION

The present invention relates to a sliding system with onboard linear motor, which has been extensively used in fields as diverse as semiconductor industries, various assembling machines, and so on.

BACKGROUND OF THE INVENTION

Sliding systems with onboard small linear motor have been used in years in extensively increased fields including semiconductor industries, various assembly machines, and so on. Modern sliding systems with onboard linear motor are further finding a multitude of potential applications. Advanced sliding systems with onboard linear motor, nevertheless, are needed to meet anticipated design specifications of more miniaturization in industries as diverse as semiconductor fabricating machines, assembly machines, and so on, making it possible to work with high speed, high acceleration/deceleration, fast response, high position-control.

A prior sliding device with onboard linear motor is disclosed in, for example Japanese Patent Laid-Open No. 2002-010617 in which the onboard linear motor employs a moving-magnet principle. The prior sliding device is made smaller in construction. With the prior sliding device recited here, an auxiliary magnet is placed out of N-pole of forward and aft magnetic end poles of the field magnet to makes up for the magnetic flux pattern at the end pole of the field magnet, thereby making the magnetic sensor element easier to detect an accurate position of the field magnet. Moreover, the prior sliding device is particularly comprised of a bed secured to any one of relatively sliding members, a table mounted to the other and allowed to move lengthwise of the bed through a linear motion guide unit, a field magnet secured on one side of the table facing on the bed and composed of magnet strips juxtaposed in an array that their polarities alternate in an sliding direction of the table and are unlike at forward and aft ends of the field magnet, an armature assembly having armature windings lying on one side of the bed facing on the table in opposition to the field magnet for carrying a current to produce a magnetomotive force that gives propulsion to the field magnet to move the table towards the desired position, and a magnetic sensor secured to the bed in opposition to the field magnet to detect strength and direction of magnetic flux.

A prior X-Y table system is disclosed in, for example Japanese Patent Laid-Open No. H09-123034 in which an output table is controlled with high acceleration/deceleration to move towards the desired position in any of X-direction and Y-direction. With the prior X-Y table system recited earlier, X-axis table and Y-axis table are not overlaid up and down in vertical direction, but staggered each other in horizontal direction. On the X-axis table, there is provided the output table that is allowed to associate with both the X-axis table and Y-axis table to move in X-Y directions towards the desired position. The X-axis table and Y-axis table are respectively provided with the driving means of linear motor. Moreover, there are provided linear motion guide units to guide the tables for linear movement while keeping constantly the moving parts of the linear motors spaced away from the stationary counterparts. The output table is associated with the Y-axis table through another linear motion guide unit that is connected with the Y-axis table at the guide rail thereof and connected with the output table at the slider thereof. With the prior X-Y table system constructed a s stated earlier, thus, the X-axis table and the Y-axis table are respectively actuated with their associated driving means of linear motor while the output table is related in motion with the X-axis table through an X-axis coupling of linear guide and also with the Y-axis table through a Y-axis coupling of linear guide.

Also disclosed in, for example Japanese Patent Laid-Open No. 2000-193060 is a pick-and-place system having a slider unit composed of a slider and a sliding guide. With the prior slider unit recited here, a return spring is constructed to make no engagement with other component such as a guide rod even after squeezed. The return spring for the slider unit is split into short parts that are joined each other through spring shoes, which fit into either the slider or the guide rod. The slider unit constructed as stated earlier is employed for the X-axis sliding mechanism of the pick-and-place system to allow a top block to make pick-and-place operation or performance by virtue of a cam arrangement.

However, any of the prior X-Y table systems recited earlier couldn't shun becoming bulky in construction. Moreover, the pick-and-place system constructed as stated earlier would need much space for, especially, the semiconductor fabricating machine where many slider units are used in juxtaposition. Thus, it would be inevitable that the semiconductor fabricating machines such as semiconductor mounting equipments and so on as a whole is bulky and space-hungry.

SUMMARY OF THE INVENTION

The present invention has as its primary object to overcome the subject stated earlier and more particular to provide a sliding system, which is comprised of a first table allowed to move in any one direction, for example in an X-direction towards any desired position, a second table allowed to move in another direction, for example in a Z-direction perpendicular to the X-direction towards any desired position, and a bed lying on any one side of the first table, the second table lying on the same side of the first table as the bed so as not to overlap one another to make the sliding system itself slim in height and compact in construction, thereby making it easier to use a plurality of the sliding systems in closely juxtaposed arrangement, and the first and second tables being actuated by linear motors independent of one another.

The present invention relates to a sliding system with onboard linear motor, comprising a bed of flat configuration, a first table lying in opposition to the bed in a way allowed to move in any one direction, a second table lying in opposition to the first table in a way allowed to move in another direction perpendicular to the one direction, a first linear motor energized to control in position any one of the bed and the first table relatively to the other in the one direction, and a second linear motor energized to control in position any one of the first and second tables relatively to the other in the another direction; and wherein the second table is arranged in opposition to the first table at the same side of the first table as the bed is laid.

In one aspect of the present invention, a sliding system with onboard linear motor is disclosed in which the first table has an extension jutting beyond the bed, and the second table is laid in opposition to the extension of the first table.

In another aspect of the present invention, a sliding system with onboard linear motor is disclosed in which the first linear motor is composed of a first field magnet and a first armature assembly lying in opposition to the first field magnet, which are both arranged between the bed and the first table, and wherein any one of the first field magnet and the first armature assembly is installed on the side of the first table while the other is installed on the bed. In a further another aspect of the present invention, there is provided a sliding system with onboard linear motor in which the bed and the first table are both made of steel, so that the first table serves as a yoke for any one of the first field magnet of the first armature assembly of the first linear motor while the bed serves as a yoke for the other.

In another aspect of the present invention, a sliding system with onboard linear motor is disclosed in which the second linear motor is composed of a second field magnet and a second armature assembly lying in opposition to the second field magnet, which are both arranged between the first and second table, and wherein any one of the second field magnet and the second armature assembly is installed on the first table while the other is installed on the second table. In yet another aspect of the present invention, there is provided a sliding system with onboard linear motor in which the first and second tables are both made of steel, so that the first table serves as a yoke for any one of the second field magnet of the second armature assembly of the second linear motor while the second table serves as a yoke for the other.

In another aspect of the present invention, a sliding system with onboard linear motor is disclosed in which the first table is an X-table allowed to move in and out in the one direction of X-direction while the second table is a Z-table allowed to move in and out in a Z-direction perpendicular to the X-direction, making it possible to carry out pick-and-place performance.

In another aspect of the present invention, a sliding system with onboard linear motor is disclosed in which a stand is joined with the bed in a geometry lying adjacent to the extension of the first table.

With the sliding system constructed as stated earlier, the first table is allowed to move in and out in the X-direction towards any desired position while the second table is allowed to move in and out in the Z-direction towards any desired position. The bed and the Z-table are both arranged on the same side of the X-table to render the sliding system as a whole slim or compact in height or thickness. Thus, the sliding system of the present invention is made less in height or thickness than the previous version of the same sort as constructed to make position control in the coordinates of X- and Z-directions with the onboard linear motors. The sliding system constructed as stated earlier makes it easier to provide the semiconductor fabricating machines, various assembly machines, especially the pick-and-place arrangement compact in construction in which dozens of the sliding systems are used in close juxtaposition with one another, with saving more space for the machines.

The above and other related aspects and features of the present invention will be more apparent to those skilled in the art from a reading of the following description of the disclosure found in the accompanying drawings and the novelty thereof pointed out in the appended claims.

DETAILED DESCRIPTION OF THE PREFERRED EMBODIMENTS

The sliding system with an onboard linear motor of the present invention is envisaged incorporating it in a diversity of machinery including semiconductor manufacturing equipments, various assembling machines, pick-and-place machines, and so on, which are expected to operate in controlled atmosphere including clean room, clean environment, and so on.

Preferred embodiments of a sliding system with onboard linear motor according to the present invention will be explained hereinafter in detail with reference to the accompanying drawings.

The sliding system of the present invention will be employed in a variety of machines including semiconductor fabricating machines, assembling machines, and so on, which are expected to work in any specific area as in, for example clean rooms, testing/experimental laboratories, and the like. The sliding system of the present invention is allowed to work in any two directions; especially X-direction and Z-direction crossed with one another to move any article towards a desired position. More particular, the sliding system developed according to the present invention is made much less in construction, especially in thickness or height than previous versions. It is to be noted that the sliding system of the present invention is suitable for a pick-and-place machine in which a plurality of the sliding systems are used in a closely juxtaposed arrangement.

The sliding system of the present invention is made based on the existing sliding device with onboard moving-magnet linear motor, which is disclosed in the commonly assigned Japanese Patent Laid-Open No. 2002-010617. Constructions of the linear motion guide means, linear motor and linear encoder in the sliding system are known in the art and recited in general in Japanese Patent Laid-Open No. 2002-010617, the disclosure of which is incorporated herein by reference.

Figure 1:
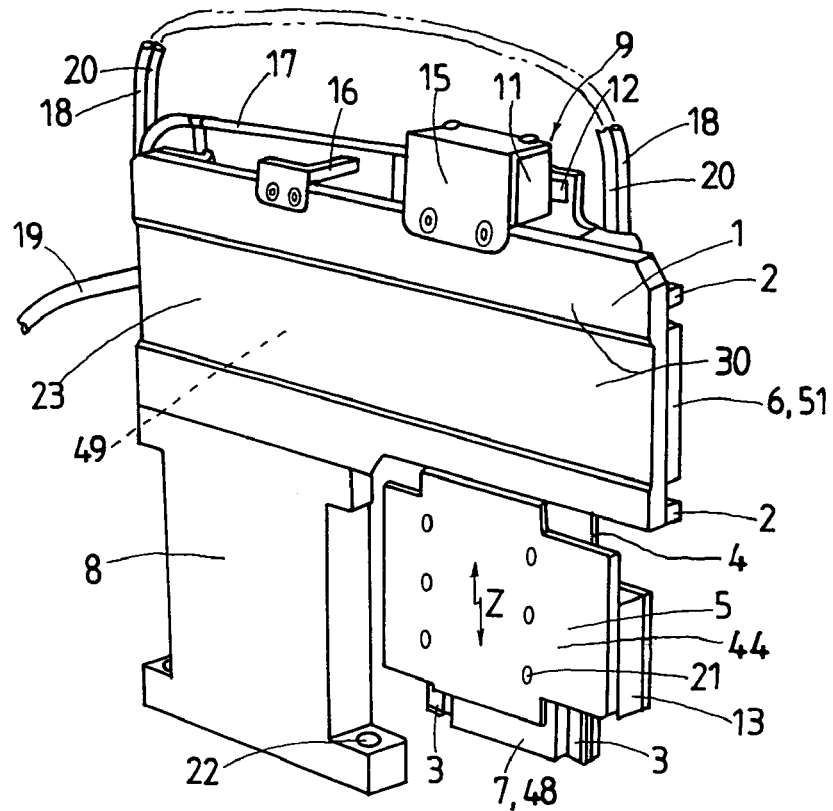
FIG. 1 is a partially cutaway view in perspective illustrating a preferred embodiment of a sliding system according to the present invention.
Figure 2:
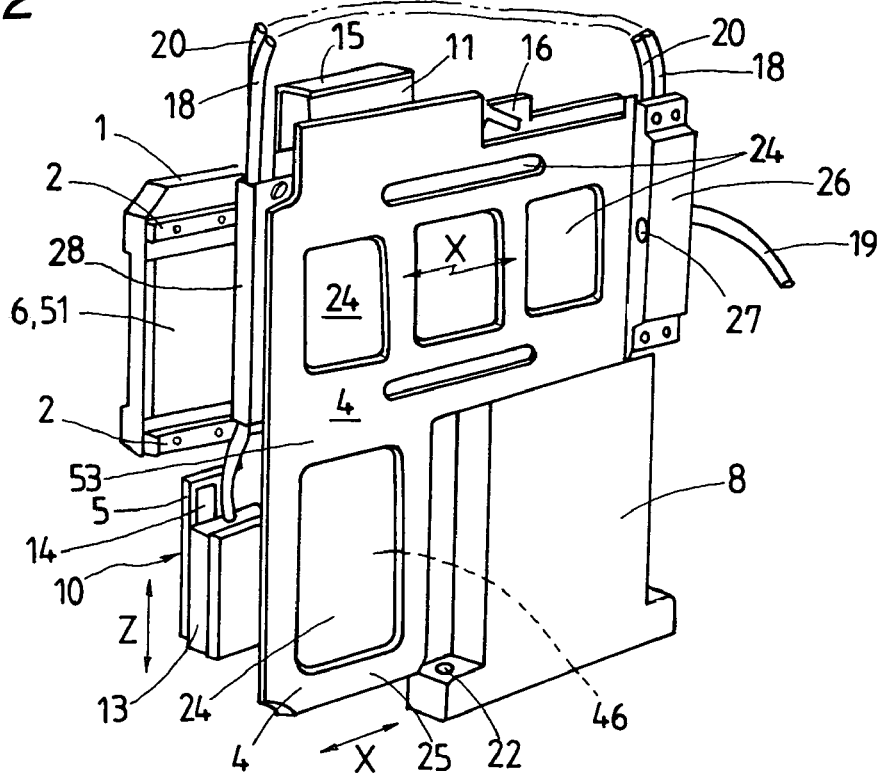
FIG. 2 is a view in perspective of the sliding system as viewed from another side opposite to the side seen in FIG. 1.
Figure 4:
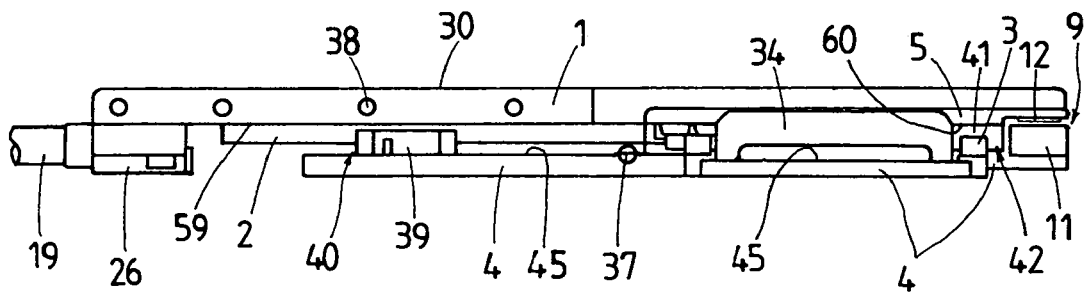
FIG. 4 is a view in bottom plan of the sliding system of FIG. 1.

The sliding system of the present invention, as shown in FIGS. 1 and 2, is made in a version preferable to, especially pick-and place arrangement. The present sliding system includes a bed 1 of rectangle in shape whose one edge or a bottom edge in FIGS. 1 and 2 has threaded holes 38, refer to FIG. 4, which are used to fasten a separate stand 8 thereto. The present sliding system is shown in standing posture. The sliding system further includes an X-table or first table 4 lying on any one side of the bed 1 in a way allowed to move in any one direction or X-direction relatively to the bed 1, and a Z-table or second table 5 lying on the same side of the bed 1 as the X-table 4 in a way allowed to move in a Z-direction perpendicular to the X-direction relatively to the bed 1. Thus, the Z-table 5 is made to provide an X-Z sliding unit allowed to move relatively to the bed 1 in the X-direction while in the Z-direction, making it possible to carry out pick-and-place performance.

The sliding system of the present invention will be applied to the pick-and-place arrangement with a variety of chucks, grips, and so on, not shown, which are fastened to the Z-table 5. The stand 8 is joined with the bed 1 in a geometry lying adjacent to an extension 25 of the X-table 4, and made therein with holes 22 that allow threads to extend through there to fasten the sliding system to any machine bed, base, and so on, not shown. As an alternative, the stand 8 may be made integral with the bed 1.

The X-table 4, as shown in FIG. 2, is a flat member of a generally inverted L-shape, which lies along any one side of the bed 1 joined with the stand 8 and includes therein the extension 25 jutting largely downwards beyond the bed 1. The X-table 4, moreover, is installed for linear movement relative to the bed 1 in the X-direction. The Z-table 5, as seen in FIG. 1, is installed on an inside surface 45 of the extension 25 of the X-table 4 in opposition to the bed 1 in such a way allowed to move relatively to the X-table 4 in the Z-direction perpendicular to the X-direction. The geometry where the Z-table 5 is placed on the inside surface 45 of the X-table 4 in opposition to the bed 1 results in making the sliding system less in the overall height or thickness (B), refer to FIG. 6, extending across from a front surface 30 of the bed 1 to an outside surface 53 of the X-table 4. Thus, the sliding system operable in the X-Z coordinates may be made much less or slim in thickness and construction.

Referring to FIGS. 3 to 7 where the sliding system is shown in a standing position but the stand 8 in FIG. 1 being removed from the bed 1, the sliding system is comprised of an X-Z sliding arrangement in which the Z-table 5 is allowed to move in both the X-direction and Z-direction relatively to the bed 1 to perform the pick-and-place operation. Any chuck, grip and the like used in practical pick-and-place arrangements are, although not shown, mounted on the Z-table 5.

Figure 7:
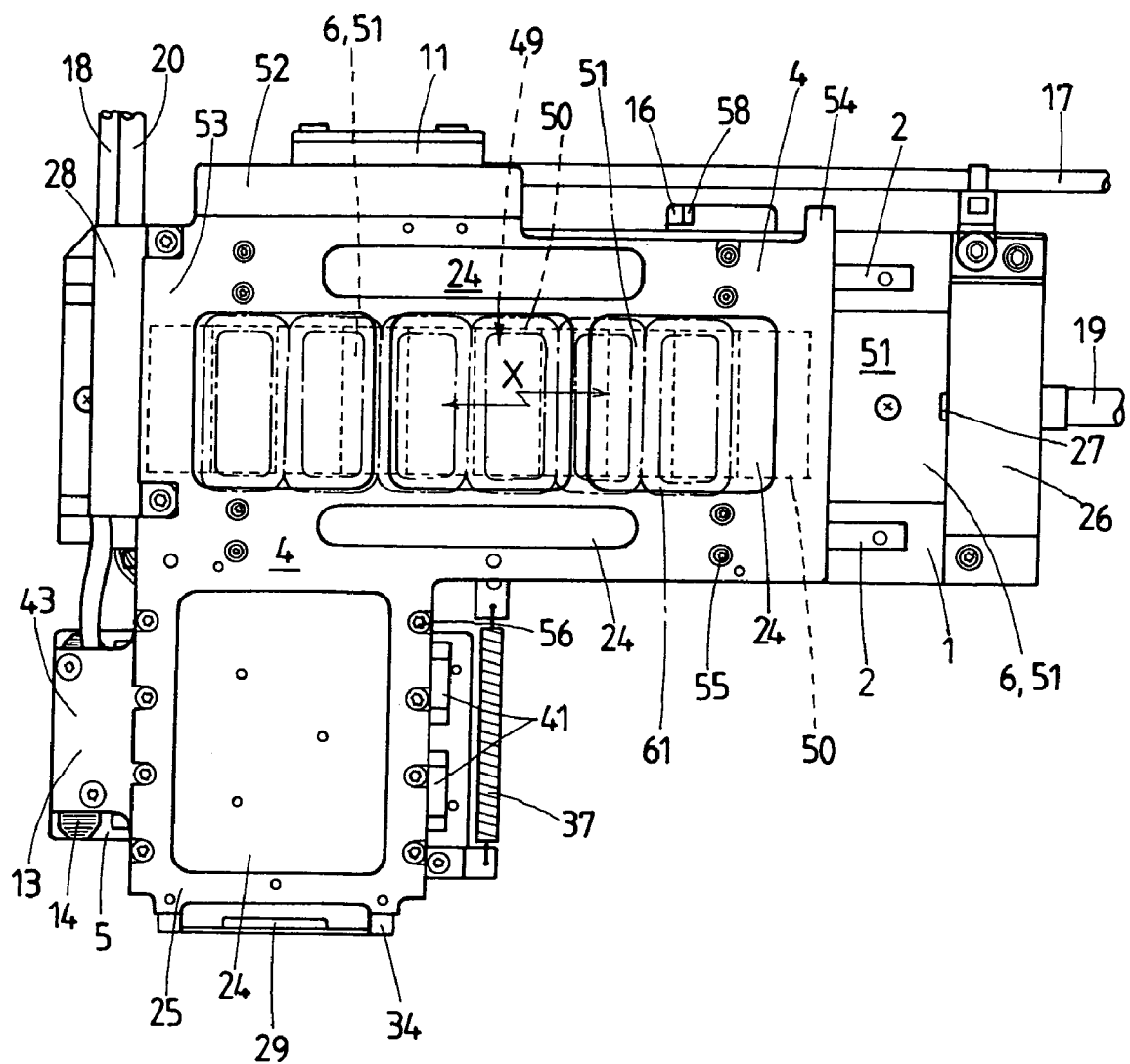
FIG. 7 is a view in rear elevation of the sliding system in FIG. 3.

The bed 1 in the version illustrated here, as made separately from the stand 8, has a flat configuration of rectangle extending lengthwise of the X-direction. On an inward surface or backside 59 of the bed 1, there are provide linear motion guide units 40 in such a construction that their guide rails 2 are fastened lengthwise to the bed 1 with screws while their sliders 39 are fastened to the X-table 4 with fitting or conforming over the guide rails 2 for sliding movement along their associated guide rails 2. The X-table 4, as seen in FIG. 7, is a flat member of a generally inverted L-shape having therein the extension 25 jutting largely over any one lengthwise edge of the bed 1. The X-table 4 is allowed to move in the X-direction or the lengthwise direction of the bed 1 by virtue of the linear motion guide units 40 whose sliders 39 are fastened to the inside surface 45 of the X-table 4 with using screws 55.

Figure 3:
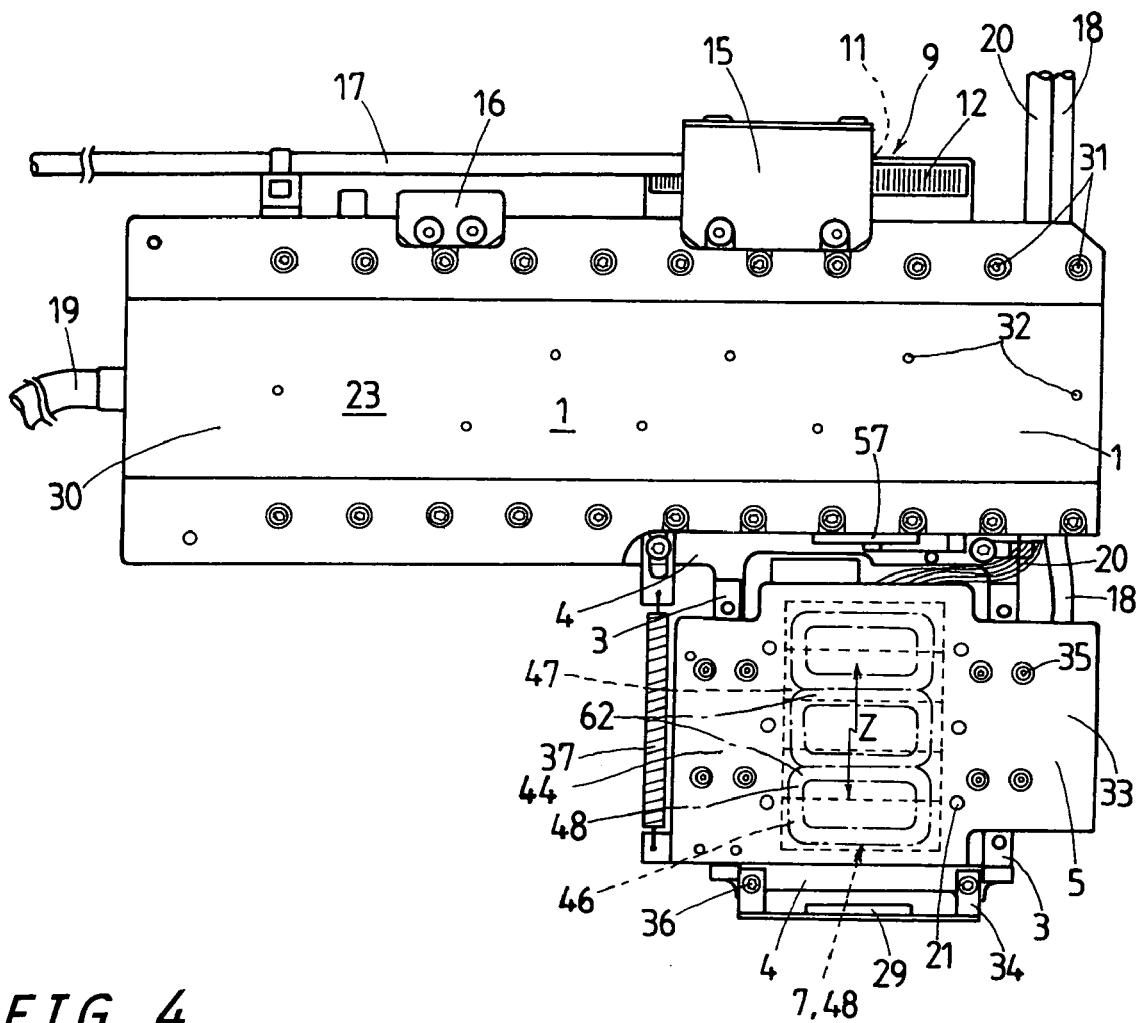
FIG. 3 is a view in front elevation of the sliding system of FIG. 1, but a stand being shown removed.

Other linear motion guide units 42 are interposed between the Z-table 5 and the extension 25 of the X-table 4 in such a construction that their guide rails 3 extending in the Z-direction perpendicular to the X-direction are fastened on the inside surface 45 of the extension 25 of the X-table 4 with using screws while their sliders 41 are secured to the Z-table 5 with fastener screws 35 to fit or conform over the associated guide rails 3 for linear movement along the guide rails 3. The Z-table 5, as shown in FIG. 3, is placed sidewise jutting downwards in FIG. 3 beyond any one lengthwise edge of the bed 1, especially in a way lying in opposition to the inside surface 45 of the extension 25 of the X-table 4. Four sliders 41 are fastened to an inward surface 60 of the Z-table 5 with using screws to constitute the linear motion guide units 42 in cooperation with their associated guide rails 3, which are secured on the extension 25 of the X-table 4. Thus, the Z-table 5 is allowed to move in and out in the Z-direction through the linear motion guide units 42.

With the sliding system constructed as stated earlier, the bed 1, X-table 4 and Z-table 5 are all made of steel. A linear motor 49 to activate the X-table 4 is installed between the inward surface 59 of the bed 1 and the inside surface 45 of the X-table 4 while another linear motor 46 to activate the Z-table 5 is installed between the inside surface 45 of the X-table 4 and the inward surface 60 of the Z-table 5. The bed 1, X-table 4 and Z-table 5 in the sliding system of the present invention are all constructed to make yokes to establish magnetic circuits or paths.

With the sliding system constructed as stated earlier, especially, the bed 1 having armature windings 61 thereon serves as a winding yoke while the X-table 4 installed thereon with a field magnet 50 functions as a magnet yoke, which cooperates with the armature windings 61 to provide a linear motor 49. Moreover, the X-table 4 has other armature windings 62 thereon to serve as another winding yoke, and the Z-table 5 is mounted with another field magnet 47 to have the function of another magnet yoke that associates with the magnet yoke of the field magnet 50 to constitute another linear motor 46. Thus, the X-table 4 has the function of the magnet yoke for the linear motor 49, while it serves as the winding yoke for the other linear motor 46.

The linear motor 49 is built in between the bed 1 and the X-table 4 to control the relative position between them. The linear motor 49 may be made to have the arrangement of the type disclosed in, for example Japanese Patent Laid-Open No. 2002-010617 recited earlier. The linear motor 49 is mainly comprised of an armature assembly 51 having the coreless armature windings 61 wound in the form of flat rectangle and laid closely in juxtaposition in the sliding direction, and the field magnet 50 of a plurality of permanent-magnet strips lying closely in juxtaposition in a way unlike magnetic poles alternate in polarity. With the sliding system constructed as stated earlier, the propulsion to carry out the position control is given from electromagnetic interaction of the flux of the field magnet 50 with the current in the created in the armature windings 61.

With the version discussed here, the armature assembly 6 for the X-table 4 is composed of the bed 1 serving as the winding yoke, and six pieces of the armature windings 61, which are flat in configuration and secured with adhesives or the like to a flat, thin coil board on the bed 1 in closely juxtaposed array.

Figure 6:
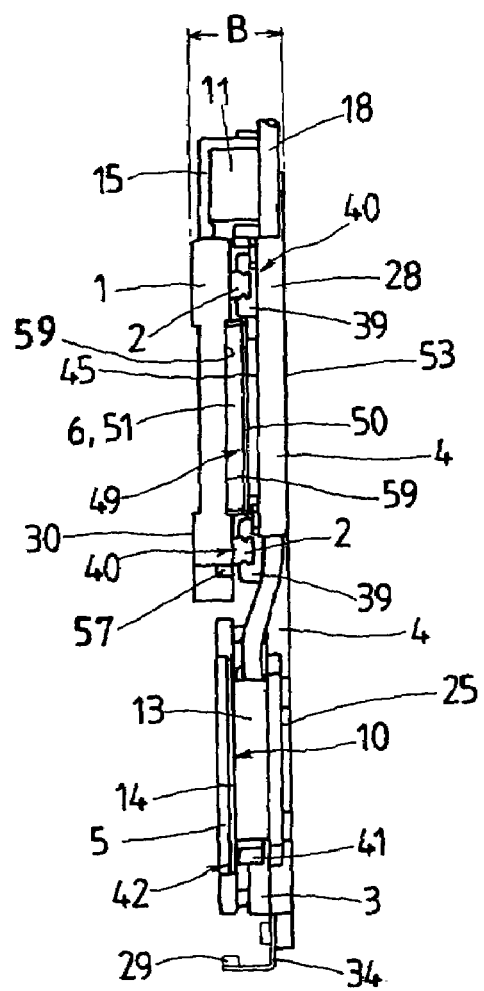
FIG. 6 is a view in side elevation of the sliding system in FIG. 3.

The armature windings in the armature assembly 51 according to the version recited earlier, as in the armature assembly disclosed in Japanese Patent Laid-Open No. 2002-010617 recited earlier, are grouped into some sets of armature windings, each of which includes three armature coreless windings for carrying each phase current of three-phase conduction system. The linear motor 49 lying between the bed 1 and the X-table 4 is, as shown in FIG. 6, installed across paired linear motion guide units 40 in a way the armature assembly 51 is secured on the back side 59 of the bed 1 along the X-direction while the field magnet 50 is fastened to the inside surface 45 of the X-table 4 along the X-direction. The linear motor 49 is made up of six pieces of the armature windings 61 and the field magnet 50 of ten magnet strips.

Electric source, driver unit for control means are installed outside the sliding system.

Both the bed 1 and the X-table 4 in the sliding system are made of magnetic material including steel, and so on. In the version illustrated here, the bed 1 serves as winding yoke while the X-table 4 functions as the magnet yoke. An encoder of an optical linear encoder 9 is provided between the bed 1 and the X-table 4 to sense any position of the X-table 4 relatively to the bed 1 in the sliding direction. The optical linear encoder 9 is composed of a linear scale 12 secured along the sliding direction or X-direction to an inward surface of a lug 52 raised somewhat over the bed 1, and a sensor 11 installed in a bracket 15 jutting in opposition to the linear scale 12. The sensor 11 is connected with a sensor line 17.

The bed 1, as shown in FIGS. 1 and 3, is made recessed across a sidewise middle area 23 of the front surface 30 thereof to make the sliding system less in weight. In the recessed middle area 23 of the bed 1, there are made threaded holes 32 that are used to fasten thereto the armature windings 61 for the linear motor 49 to actuate the X-table 4. On the front surface 30 of the bed 1, moreover, there are driven screws 31 that are tightened across the bed 1 at regular intervals along widthwise opposing side areas extending next to the recessed middle area 23 to fasten the guide rails 2 of the linear motion guide units 40.

A connector block 26 is secured to any one of forward and aft ends of the bed 1. The connector block 26 is provided to support therein an electric power line and a signal line 19 reaching the armature assembly 51, and further support another electric power line, signal line 20 and a sensor line 18 reaching the Z-table 5. On an end of the X-table 4 remote lengthwise from the connector block 26, there is provided a cord retainer 28 to support therein the electric power line, signal line 20 and the sensor line 18 for the Z-table 5. On both the bed 1 and the X-table 4, there are provided stopper means to keep the X-table against disengaging out of the bed 1 or to limit a traveling stroke of the X-table within a preselected distance. Any one of the stopper means is constituted with an inward surface of the connector block 26 secured to any one of forward and aft ends of the bed 1 to come into engagement with the opposing end of the X-table 4 to keep the X-table 4 against disengaging out of the bed 1. Another stopper means is constituted with a stopper lug 54 raised sidewise beyond the lengthwise edge of the X-table 4 and stopper arm 16 fastened to the bed 1 in opposition to the stopper lug 54 to bring the X-table 4 to a stop after having come into abutment against the stopper lug 54. Elastic absorber pads 27 to ease collision are provided on both the stopper arm 16 and the middle area of the inward surface of the connector block 26.

The X-table 4, as seen in FIG. 7, is made recessed below the outside surface 53 thereof at some appropriate areas 24 to make the moving table itself less in weight. The linear motor 46 is installed between the X-table 4 and the Z-table 5 to accurately actuate the Z-table 5 relative to the X-table 4 towards any desired position. On the outside surface 53 of the X-table 4, fastening screws 55 are driven to secure thereto the sliders 39 of the linear motion guide units 40 for the X-table 4. On the extension 25 of the X-table 4, moreover, other fastening screws 56 are tightened to mount thereon the guide rails 3 of the linear motion guide units 42 for the Z-table 5. The lug 52 rising over the bed 1 is made in opposition to the location of the sensor 11. The linear motor 46 is, as with the linear motor 49, comprised of the armature assembly 48 having the coreless armature windings 62 wound in the form of flat rectangle and laid closely in juxtaposition in the sliding direction, and the field magnet 47 of a plurality of permanent-magnet strips lying closely in juxtaposition in a way unlike magnetic poles alternate in polarity. With the sliding system constructed as stated earlier, the propulsion to carry out the position control is given from electromagnetic interaction of the flux of the field magnet 47 with the current in the created in the armature windings 62.

With the embodiment explained here, the armature assembly 7 for the Z-table 5 is composed of the X-table 4 serving as the winding yoke, and three pieces of the armature windings 62, which are flat in configuration and secured with adhesives or the like to a flat, thin coil board on the X-table 4 in close juxtaposition with one another. Electric source, driver units for control means are installed outside the sliding system.

Figure 5:
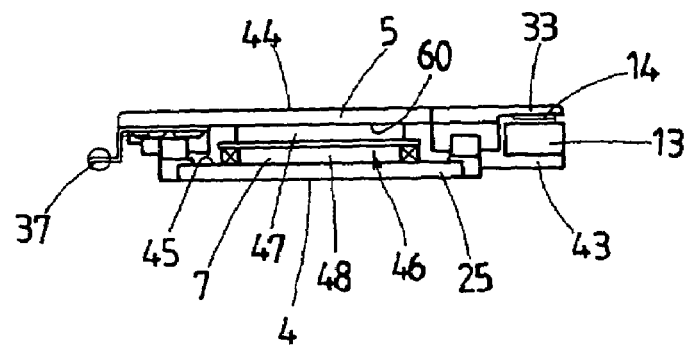
FIG. 5 is a view in bottom plan of a second table, but a stopper means being shown removed in FIG. 4.

The linear motor 46 is composed of three pieces of armature windings 62, and the field magnet 47 having five poles of permanent magnet strips. The armature assembly 48 in the linear motor 46, as in the linear motor 49, especially has a set of three coreless armature windings 62, each of which carries each phase current of three-phase conduction system. The linear motor 46 lying between the X-table 4 and the Z-table 5 is, as shown in FIG. 5, installed across paired linear motion guide units 42 in a way the armature assembly 48 is secured on the inside surface 45 of the extension 25 of the X-table 4 along the Z-direction perpendicular to the X-direction while the field magnet 47 is fastened to the inward surface 60 of the Z-table 5 along the Z-direction in opposition to the armature assembly 48. Both of the Z-table 5 and the X-table 4 or the extension 25 are made of magnetic material including steel, and so on in such a way that the extension 25 of the X-table 4 serves as the winding yoke while the Z-table 5 serves as the magnet yoke.

With the sliding system constructed as stated earlier, thus, the X-table 4 doubles as the magnet yoke for the linear motor 49 lying on the side of the bed 1 and the winding yoke for the linear motor 46 lying on the side of the Z-table 5, thereby becoming a major contributor to make it possible to render the slider system slim or compact in construction.

There is further provided an encoder to sense a position in the Z-direction of the Z-table 5 with respect to the X-table 4. The encoder in Z-direction is made of an optical linear encoder 10, which is composed of a linear scale 14 attached to an inward surface of an sidewise extended area 33 of the Z-table 5 in the Z-direction or the moving direction of the Z-table 5, and a sensor 13 fastened to a sidewise bulged area 43 out of the extension 25 of the X-table 4 in opposition to the linear scale 14. Moreover, a stopper means are provided to keep the moving Z-table 5 against disengaging out of the bed 1 or to limit a traveling stroke of the Z-table 5 within a preselected distance. Any one of the stopper means is constituted with the side edge of the bed 1 against which the Z-table 5 will come into abutment. Another stopper means, as shown in FIG. 6, is constituted with an L-shaped metal member 34 secured to the extension 25 of the X-table 4 with using a fastening screw 36. The L-shaped metal member 34 has a buffer pad 29 while an elastic cushion pad 57 is attached to the opposite side edge of the bed 1 to relieve collision of the Z-table 5 against the bed 1.

There is provided a balancing spring 37 connecting the X-table 4 with the Z-table 5 to keep the Z-able 5 in proper weight balance. The Z-table 5, as seen in FIG. 3, is made on the front surface there with threaded holes 21 that are used to fasten any instrument including chucks, grips, and so on to the Z-table 5.

The sliding system of the present invention is made less, for example 17 mm in height or thickness (B), refer to FIG. 6, than the previous version of the same sort as constructed to make position control in the coordinates of X- and Z-directions. The sliding system constructed as stated earlier makes it easier to provide the assembly machines compact in construction in which dozens of the sliding systems are used in close juxtaposition with one another. Moreover, the sliding system with onboard linear motors 46, 49 constructed as stated earlier, despite being made as slim or small as possible in construction, meets the requirements for the advanced sliding systems, which are expected to work with high speed, high acceleration/deceleration, fast response, high position-control, and so on. Having described the sliding system of the present invention as related to the best mode shown in the accompanying drawing, it is to be understood that various variations and modifications including other constructions of the linear motor, aluminum-made bed and tables, other geometries in stand and in X-table 4, although not shown, may be well applied in conformity with design specifications, which do not constitute departures from the spirit and scope of the present invention.

What is claimed is:

1. A sliding system with onboard linear motor; comprising a bed of flat configuration made of steel engaged on a stand, a first table made of steel engaged to a side of the bed to allow movement in a X-direction through a linear motion guide unit, the first table having an extension extending out beyond the bed, a second table made of steel installed on the extension so as to lie on the same side of the first table as the bed is laid, the second table movable in a Z-direction perpendicular to the X-direction through a linear motion guide unit, a first linear motor engaged between the bed and the first table to be energized to control a position of the first table in the X-direction, and a second linear motor engaged between the first table and the second table to be energized to control a position of the second table in Z-direction; and wherein the bed, the first table and the second table serve as yokes for the first and second motors, and the second table is controlled in a position in the X-direction while movable in the Z-direction.

* * * * *